US009306647B2

United States Patent
Aryanfar

(10) Patent No.: US 9,306,647 B2
(45) Date of Patent: *Apr. 5, 2016

(54) TRACKING SYSTEM WITH ORTHOGONAL POLARIZATIONS AND A RETRO-DIRECTIVE ARRAY

(71) Applicant: Lattice Semiconductor Corporation, Portland, OR (US)

(72) Inventor: Farshid Aryanfar, Allen, TX (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,424

(22) Filed: Apr. 27, 2015

(65) Prior Publication Data

US 2015/0244441 A1    Aug. 27, 2015

Related U.S. Application Data

(63) Continuation of application No. 14/002,353, filed as application No. PCT/US2012/025312 on Feb. 15, 2012, now Pat. No. 9,026,040.

(60) Provisional application No. 61/447,844, filed on Mar. 1, 2011.

(51) Int. Cl.
*H04B 1/44* (2006.01)
*H04B 7/06* (2006.01)
(Continued)

(52) U.S. Cl.
CPC .............. *H04B 7/061* (2013.01); *H04B 1/44* (2013.01); *H04B 7/0671* (2013.01);
(Continued)

(58) Field of Classification Search
CPC ...... H01Q 3/2647; H04B 1/44; H04B 7/0671; H04B 7/0854; H04B 7/10; H03F 2200/192; H03F 2200/198; H03F 2200/204
USPC .......................................................... 455/78
See application file for complete search history.

(56) References Cited

U.S. PATENT DOCUMENTS 2,908,002 A * 10/1959 Van Atta ........................ 343/776
3,518,672 A *  6/1970 Zimmer ......................... 342/370
(Continued)

FOREIGN PATENT DOCUMENTS

JP       2005-328650 A    11/2005

OTHER PUBLICATIONS

Chung et al., "A Novel Bi-Directional Amplifier With Applications in Active Van Atta Retrodirective Arrays," IEEE Transactions on Microwave Theory and Techniques, vol. 51, No. 2, Feb. 2003, pp. 542-547. 6 pages.
(Continued)

*Primary Examiner* — Duc M Nguyen
(74) *Attorney, Agent, or Firm* — Fenwick & West LLP

(57) ABSTRACT

The disclosed embodiments relate to a retro-directive array that facilitates a tracking operation. This retro-directive array includes a first antenna configured to receive an input signal which is substantially circularly polarized from a tracking device. The first antenna separates the input signal into two signal components (e.g., $E_x$ and $E_y$) associated with different orthogonal polarizations, wherein the two signal components comprise a quadrature signal wherein $E_y=j \cdot E_x$. The retro-directive array also includes a bi-directional quadrature gain (BQG) module coupled to the first antenna which is configured to boost the quadrature signal. It additionally includes a second antenna which configured to transmit the boosted quadrature signal to the tracking device. The disclosed embodiments also relate to a transceiver switch, which includes: an input configured to receive a signal to be transmitted, and two phase mixers configured to receive the signal to be transmitted and phase inputs I and Q, and to produce a signal comprising two quadrature signal components $S_I$ and $S_Q$, respectively, wherein $S_Q=j\,S_I$. The transmit switch also includes a hybrid coupler, which is configured to combine $S_I$ phase shifted by 180° with $S_Q$ phase shifted by 90° to produce a transmit output which is proportionate to S; and a switching mechanism configured to turn off the transmit output by swapping the phase inputs I and Q to the phase mixers.

20 Claims, 9 Drawing Sheets

(51) Int. Cl.
*H04B 7/08* (2006.01)
*H04B 7/10* (2006.01)
*H04L 27/12* (2006.01)
*H01Q 3/26* (2006.01)

(52) U.S. Cl.
CPC .............. *H04B 7/0854* (2013.01); *H04B 7/10* (2013.01); *H04L 27/12* (2013.01); *H01Q 3/2647* (2013.01); *H03F 2200/198* (2013.01); *H03F 2200/204* (2013.01)

(56) References Cited

U.S. PATENT DOCUMENTS

| | | | | |
|---|---|---|---|---|
| 3,748,601 | A * | 7/1973 | Seidel | H03H 7/38 333/109 |
| 3,757,335 | A * | 9/1973 | Gruenberg | 342/367 |
| 3,967,220 | A * | 6/1976 | Tagashira | H04B 3/148 333/109 |
| 5,019,793 | A * | 5/1991 | McNab | H01P 5/04 333/139 |
| 5,254,997 | A * | 10/1993 | Cohn | 342/44 |
| 5,430,411 | A * | 7/1995 | Boulic | 330/284 |
| 6,374,017 | B1 * | 4/2002 | Romaniuk | G02B 6/12004 326/99 |
| 6,445,904 | B1 * | 9/2002 | Lovinggood et al. | 455/7 |
| 7,592,881 | B2 * | 9/2009 | Salomon | H03F 3/604 333/117 |
| 8,103,225 | B2 * | 1/2012 | Couchman et al. | 455/127.1 |
| 9,026,040 | B2 * | 5/2015 | Aryanfar | 455/7 |
| 2003/0162566 | A1 * | 8/2003 | Shapira et al. | 455/561 |
| 2004/0110469 | A1 * | 6/2004 | Judd et al. | 455/15 |
| 2005/0266902 | A1 * | 12/2005 | Khatri | H04B 7/10 455/575.7 |
| 2008/0076360 | A1 * | 3/2008 | Curtin | H04B 1/44 455/78 |
| 2009/0130990 | A1 * | 5/2009 | Rofougaran | 455/73 |
| 2009/0149146 | A1 * | 6/2009 | Emrick et al. | 455/277.2 |
| 2010/0259447 | A1 * | 10/2010 | Crouch | 342/374 |
| 2010/0260076 | A1 * | 10/2010 | Corman et al. | 370/277 |
| 2011/0285593 | A1 * | 11/2011 | Cavirani et al. | 342/457 |
| 2011/0312269 | A1 * | 12/2011 | Judd et al. | 455/11.1 |
| 2012/0001735 | A1 * | 1/2012 | Fink et al. | 340/10.4 |
| 2012/0212371 | A1 * | 8/2012 | Chang | 342/373 |
| 2012/0289338 | A1 * | 11/2012 | Chen et al. | 463/39 |

OTHER PUBLICATIONS

Leong et al., "Moving Forward in Retrodirective Antenna Arrays," IEEE Potentials, Aug./Sep. 2003, pp. 16-21. 6 pages.

Lim, Sungjoon et al., "60-GHz Retrodirective Array System with Efficient Power Management," 36th European Microwave Conference, 2006, pp. 314-317, Sep. 10-15, 2006. 4 pages.

Miyamoto et al., "A Reconfigurable Active Retrodirective/Direct Conversion Receiver Array for Wireless Sensor Systems," 2001 IEEE MTT-S Digest, pp. 1119-1122. 4 pages.

PCT International Preliminary Report on Patentability dated Sep. 12, 2013 (Chapter I) in International Application No. PCT/US2012/025312, 8 pages.

Sawada, H. et al., "Polarization dependence in double directional propagation channel at 60GHz," 2009 IEEE 20th International Symposium on Personal, Indoor and Mobile Radio Communications, pp. 3010-3014, Sep. 13-16, 2009. 5 pages.

* cited by examiner

TRACKING SYSTEM WITH ORTHOGONAL POLARIZATIONS AND A RETRO-DIRECTIVE ARRAY

CROSS REFERENCE TO RELATED APPLICATIONS

This application is a continuation of U.S. patent application Ser. No. 14/002,353 entitled "Tracking System with Orthogonal Polarizations and a Retro-Directive Array," filed on Aug. 29, 2013, which is a U.S. national phase application for International Patent Cooperation Treaty Application PCT/US12/25312, filed Feb. 15, 2012, entitled "Tracking System with Orthogonal Polarizations and a Retro-Directive Array," which claims the benefit of U.S. Provisional Patent Application No. 61/447,844, filed Mar. 1, 2011, entitled "Tracking System with Orthogonal Polarizations and a Retro-Directive Array." The entirety of each of the foregoing patents, patent applications, and patent application publications is incorporated by reference herein.

BACKGROUND

1. Field

The disclosed embodiments generally relate to tracking systems that use retro-directive arrays. More specifically, the disclosed embodiments relate to the design of a tracking system that uses orthogonal polarizations to facilitate efficient operation of a retro-directive array and associated transmit-receive switches.

2. Related Art

Tracking systems based on phase arrays have been used for many years in military radar applications. Recent technological developments are beginning to make it practical to apply these technologies to consumer applications, for example to track controller device from game console. In contrast to military radar applications, the targets for consumer applications can cooperate to ease the tracking process. However, the only practical frequency band for such applications is in the millimeter-wavelength range, which facilitates fitting a small antenna array with a reasonable number of elements to provide fine beam resolution inside a consumer electronic device.

Unfortunately, the poor performance of complementary metal-oxide-semiconductor (CMOS) circuitry at high frequencies can create a significant power burden, which in turn, can adversely affect the battery life of a portable device. It is therefore important to minimize power consumption to enable such technologies to be deployed in mobile applications. This can be done in part by employing a retro-directive array which uses less power on the low-power mobile side of a wireless link. However, conventional retro-directive arrays, which perform frequency conversion using a mixer and a local oscillator running at twice the RF transmission frequency, are not efficient when implemented in CMOS and can consume a considerable amount of power.

Moreover, on the console (base station) side of the link, tracking circuitry typically alternates between transmitting and listening to the echo, which means that the circuitry needs to rapidly switch between the transmitter and the receiver. However, it is a challenging task to build a decent switch for these high frequencies, with high isolation, low attenuation and high speed.

DETAILED DESCRIPTION

Figure 1A:
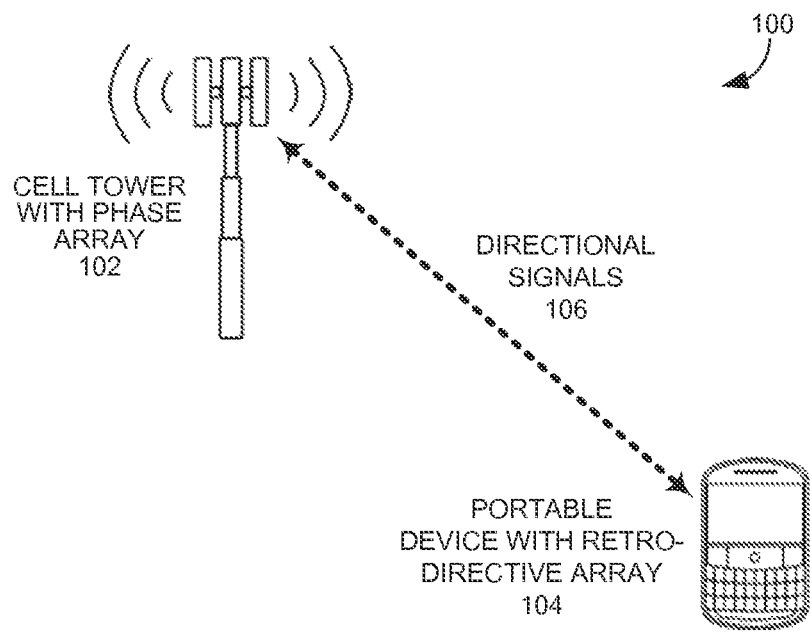
FIG. 1A illustrates a portable electronic device communicating with a cell tower in accordance with the disclosed embodiments.
Figure 1B:
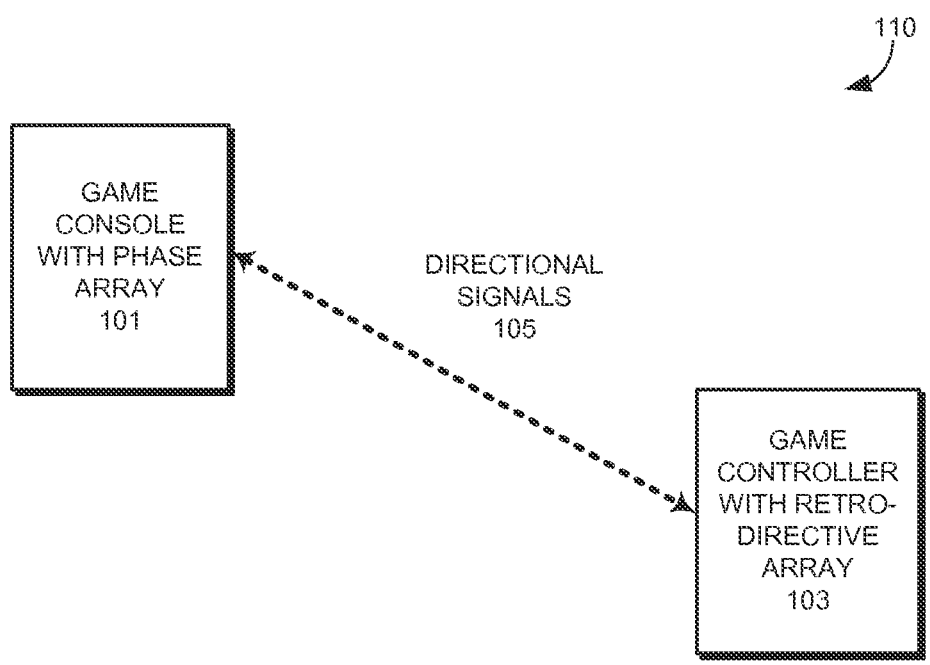
FIG. 1B illustrates a game console communicating with a game controller in accordance with the disclosed embodiments.

The disclosed embodiments relate to a tracking system that uses orthogonal polarizations to facilitate efficient operation of a retro-directive array and associated transmit-receive switches. An example embodiment of such a system 100 appears in FIG. 1A, which illustrates a cell tower 102 that includes a phase array that transmits and receives directional signals 106 and a portable device 104, such as a smartphone, which includes a retro-directive array. (Note that a "directional signal" is a signal which is transmitted through a directional antenna which focuses the energy of the signal in one or more specific directions instead of radiating the signal in all directions.) FIG. 1B illustrates another example of a tracking system 110 comprising a video game console 101 and an associated game controller 103 which includes a retro-directive array. The console 101 includes a phase array that transmits and receives directional signals 105. Discussion of the retro-directive array is provided next with reference to FIG. 2.

In some embodiments, the retro-directive array 200 (FIG. 2) uses orthogonal polarizations (and more specifically circular polarizations). In some embodiments, the use of such polarizations can eliminate the need for frequency conversion. Note that the retro-directive array 200 illustrated in FIG. 2 includes four antennas 201-204, each of which is configured to receive two signals with orthogonal polarizations, and further wherein the two signals comprise components of a circularly polarized signal. To facilitate operation of retro-directive array 200, antenna 201 is coupled to antenna 204 through a delay element $D_1$ 213 and a bi-directional quadrature gain (BQG) module 214. Similarly, antenna 202 is coupled to antenna 203 through a delay element $D_2$ 211 and a BQG module 212.

During system operation, BQG module 214 amplifies quadrature signals in both directions between antennas 201 and 204. More specifically, BQG module 214 receives a quadrature signal from antenna 201 and amplifies this quadrature signal and sends it to antenna 204. In the other direction, BQG module 214 receives a quadrature signal from antenna 204 and amplifies this quadrature signal and sends it to antenna 201. The other BQG module 212 similarly amplifies signals in both directions between antennas 202 and 203.

In some embodiments, the delay amounts introduced by delay element $D_1$ 213 and delay element $D_2$ 211 are fixed, while in others, the delay amounts can be tuned dynamically, e.g., as part of a calibration. For instance, the delay elements $D_2$ 211 and $D_1$ 213 can be configured to match the total delays between antennas 201-204 and antennas 202-203, respectively. These delay elements can compensate for one or more factors which can affect operation of the retro-directive array, including propagation delays through BQG modules 212 and 214, and the difference between signal propagation speeds through the conductors connecting the antenna pairs.

BOG Module

Figure 2:
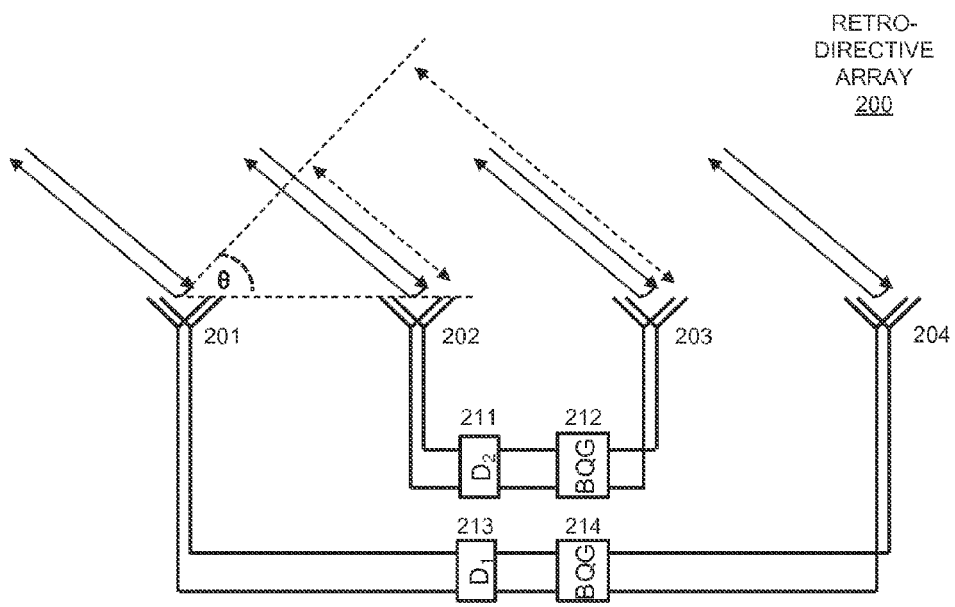
FIG. 2 illustrates a retro-directive array in accordance with the disclosed embodiments.
Figure 3:
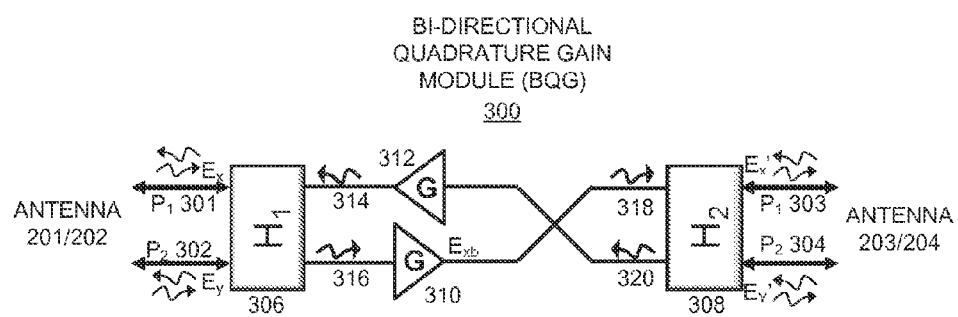
FIG. 3 illustrates the structure of a bi-directional quadrature gain (BQG) module in accordance with the disclosed embodiments.

FIG. 3 illustrates the internal structure of a bi-directional quadrature gain (BQG) module 300 in accordance with the disclosed embodiments. On the left-hand side of FIG. 3, signal lines $P_1$ 301 and $P_2$ 302 are coupled to ports of different polarization on antenna 201 or 202 (as shown in FIG. 2). In one particular case of circular polarization, $P_1$ 301 is $E_x$ and signal on $P_2$ 302 is $E_y$. $E_x$ and $E_y$ comprise a quadrature signal and have a plus or minus 90° phase difference between them depending upon whether the signal has a left-handed or right-handed circular polarization. Similarly, on the right-hand side of FIG. 3, signal lines $P_1$ 303 and $P_2$ 304 are coupled to ports of different polarization on antenna 203 or 204 (as shown in FIG. 2). (Note that a signal is said to be "substantially circularly polarized" if components of two polarizations are approximately equal, and their phase relationship remains approximately orthogonal over time.)

During operation, BQG module 300 provides amplification in two opposing directions, including a first direction and a second direction. In the first direction, a first quadrature signal received through signal lines $P_1$ 301 and $P_2$ 302 is amplified and transmitted through signal lines $P_1$ 303 and $P_2$ 304. At the same time in the second direction, a second quadrature signal received through signal lines $P_1$ 303 and $P_2$ 304 is amplified and transmitted through signal lines $P_1$ 301 and $P_2$ 302.

In one specific case of circular polarization, the amplification of the first quadrature signal in the first direction involves the following operations. First, hybrid coupler $H_1$ 306 receives the two signal components $E_x$ and $E_y$ which comprise the first quadrature signals from the first antenna 201 or 202, wherein $E_y = j E_x$. $H_1$ 306 combines $E_x$ phase shifted by 90° with $E_y$ phase shifted by 180° to produce an output on signal line 314, wherein the vectorial sum of the two inputs $E_x$ and $E_y$ cancel each other to produce the output on signal line 314 which equals $(jE_x - E_y)/\sqrt{2} = (jE_x - jE_x)/\sqrt{2} = 0$.

At the same time, $H_1$ 306 combines $E_x$ phase shifted by 180° with $E_y$ phase shifted by 90° to produce an output on signal line 316 which equals $(-E_x + jE_y)/\sqrt{2} = (-E_x - E_x)/\sqrt{2} = -\sqrt{2} E_x$. Next, gain element G 310 receives the output from signal line 316 and produces a boosted second output $E_{xb}$.

Then, hybrid coupler $H_2$ 308 receives the second boosted output $E_{xb}$ from signal line 318 and produces two outputs $E_x'$ and $E_y'$ that comprise the boosted first quadrature signal which is transmitted to the second antenna. More specifically, $H_2$ 308 generates $E_{xb}$ phase shifted by 90° to produce an output $jE_{xb} = E_x'$ on signal line $P_1$ 303, and also generates $E_{xb}$ phase shifted by 180° to produce an output $-E_{xb} = j(jE_{xb}) = j E_x'$ and $E_y'$ on signal line $P_2$ 304.

The amplification of the second quadrature signal in the second direction operates in a similar manner. In particular, $H_2$ 308 receives the second quadrature through signal lines $P_1$ 303 and $P_2$ 304 from the second antenna and produces a first output (with a 0 value) on node 318 and a second output on node 320. Next, gain element 312 boosts the second output on node 320 and feeds the boosted second output through hybrid coupler $H_1$ 306 to produce a boosted second quadrature signal on signal lines $P_1$ 303 and $P_2$ 304 which feeds into the first antenna. In the embodiment shown in FIG. 3, $H_1$ 306 and $H_2$ 308 share the same orientation with respect to their respective input ports, thus requiring the signal crossing depicted in FIG. 3. In other embodiments, the orientation can be different.

In addition to providing low power consumption, the embodiment illustrated in FIG. 3 may improve signal-to-noise ratio (SNR) by reducing the reflected energy from surrounding clutter. More specifically, a reflected wave from an object causes a change from left-handed circular polarization to right-handed circular polarization and vice versa, making reflections from objects orthogonal to a desired signal reflected back by the target.

Hybrid Couplers

Figure 4A:
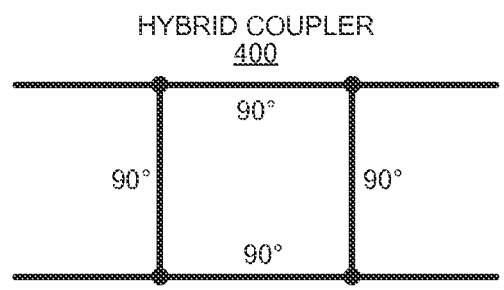
FIG. 4A illustrates a hybrid coupler in accordance with the disclosed embodiments.
Figure 4B:
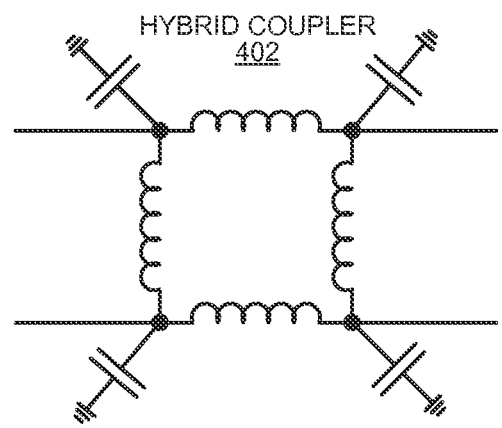
FIG. 4B illustrates another hybrid coupler in accordance with the disclosed embodiments.

FIGS. 4A and 4B illustrate different implementations of a hybrid coupler in accordance with the disclosed embodiments. These hybrid couplers can be implemented using interconnected passive 90° delay elements. For example, FIG. 4A illustrates a hybrid coupler 400 comprised of a set of interconnected conductors, wherein the length of each conductor is tuned to provide a 90° delay. FIG. 4B presents an alternative implementation of a hybrid coupler 402 wherein the 90° delay elements are implemented using inductors and associated capacitors.

Up-Link and Down-Link Data Transfers

Figure 5A:
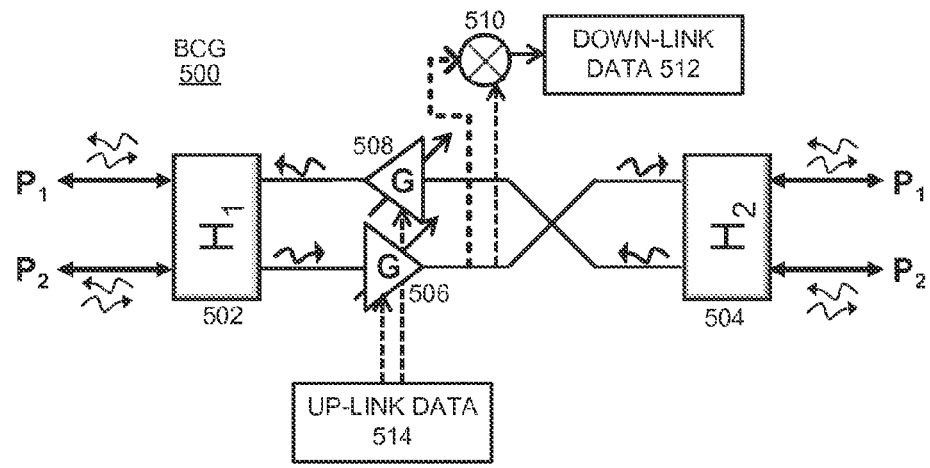
FIG. 5A illustrates circuitry to support up-link and down-link data transmissions in accordance with the disclosed embodiments.
Figure 5B:
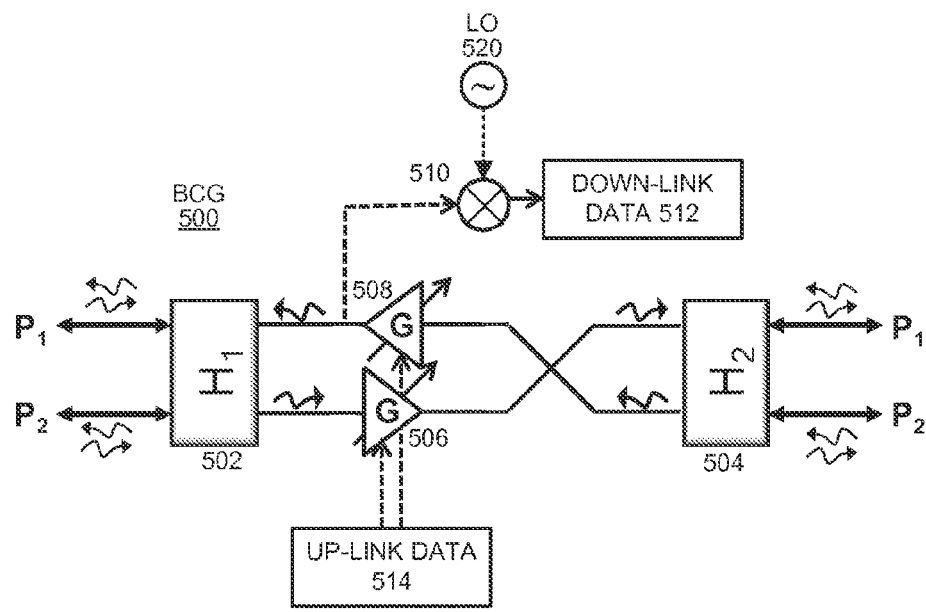
FIG. 5B illustrates alternative circuitry to support up-link and down-link data transmissions in accordance with the disclosed embodiments.

FIG. 5A illustrates circuitry 500 to support up-link and down-link data transmissions in accordance with the disclosed embodiments. This circuitry is the same as the circuitry in the BQG module illustrated in FIG. 3, except for two additions. To facilitate up-link data transfers, gain elements 506 and 508 are modulated to transmit up-link data 514 to a remote receiver, which for example may be located in a cell tower, such as cell tower 102. To facilitate down-link data transfers, the system includes circuitry 510 which implements a self-mixing/zero intermediate frequency (IF) circuit to receive down-link data 512 from a remote transmitter, which may similarly be located in a cell tower, such as cell tower 102. This self-mixing circuitry 510 operates by multiplying a signal by itself. For example, multiplying $a(t)\cos(\omega_0 t)^x$ $a(t)\cos(\omega_0 t) = [a(t)\cos(\omega_0 t)]^2 = a^2(t)/2 + (a^2(t)/2)\cos(2\omega_0 t)$. Next, the $(a^2(t)/2)\cos(2\omega_0 t)$ term can be filtered out leaving the $a^2(t)/2$ term.

FIG. B illustrates alternative circuitry to support up-link and down-link data 1 transmissions in accordance with the disclosed embodiments. This circuitry is the same as the circuitry illustrated in FIG. 5A, except that the down-link data signal from gain element 508 is mixed with a local oscillator signal (LO) 520 instead of being self-mixed.

Operating a Retro-Directive Array

Figure 6:
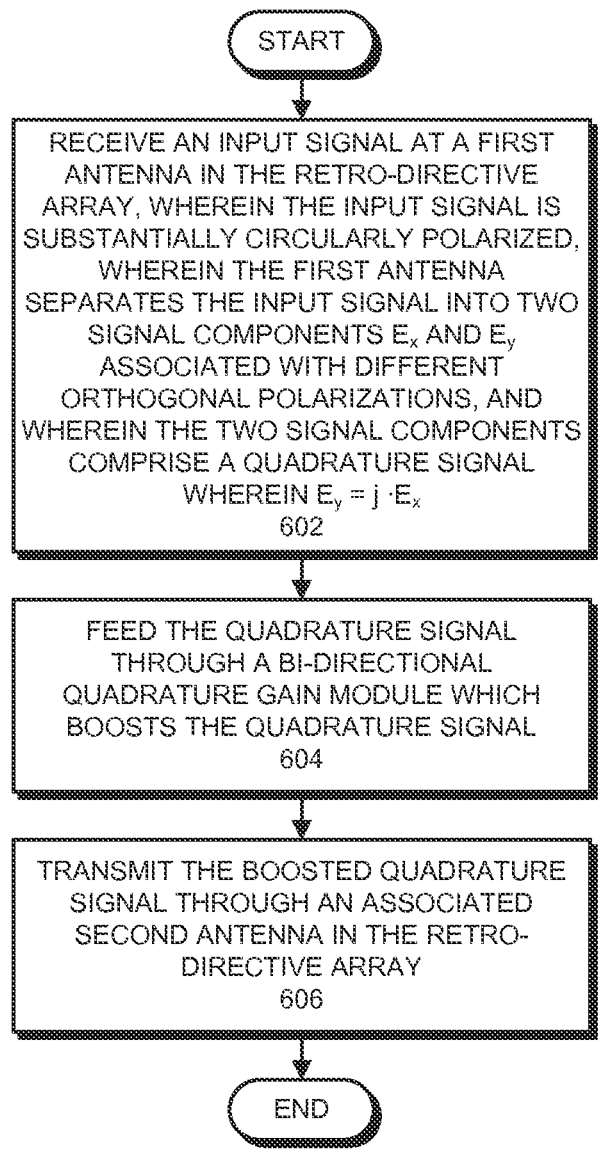
FIG. 6 presents a flow chart illustrating operation of a retro-directive array in accordance with the disclosed embodiments.

FIG. 6 presents a flow chart illustrating operation of a retro-directive array in accordance with the disclosed embodiments. The system illustrated in FIG. 3 first receives an input signal at a first antenna (e.g. 201 or 202 (as shown in FIG. 2)) in a retro-directive array, wherein the input signal is substantially circularly polarized (step 602). Note that the first antenna separates the input signal into two signal components associated with different orthogonal polarizations (e.g., $E_x$ and $E_y$), wherein the two signal components comprise a first quadrature signal where $E_y = j \cdot E_x$. Next, the system feeds the first quadrature signal through a BQG module 300 which boosts the quadrature signal (step 604). The system then transmits the boosted first quadrature signal through an associated second antenna (e.g. 203 or 204 (as shown in FIG. 2)) in the retro-directive array (step 606).

At the same time, the system performs the same operation in the reverse direction (which is not illustrated in FIG. 6). In the reverse direction, the system receives a second quadrature signal from the second antenna (e.g. 203 or 204 (as shown in FIG. 2)) and uses the BQG module 300 to boost the second quadrature signal before transmitting the boosted second quadrature signal through the first antenna (e.g. 201 or 202 (as shown in FIG. 2)).

Transmit Switch

Figure 7A:
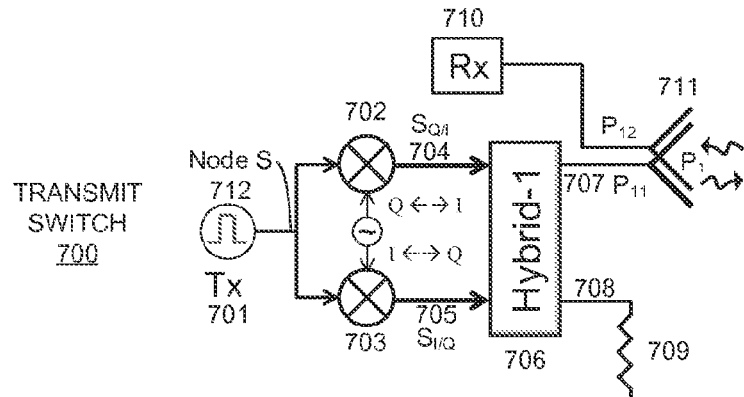
FIG. 7A illustrates a transmit switch in accordance with the disclosed embodiments.

FIG. 7A illustrates a transmit switch 700 in accordance with the disclosed embodiments. Transmit switch 700 uses orthogonal polarizations to perform the functions of a conventional switch in a time-division multiplexed (TDM) system without the associated limitations of a conventional switch with regards to SNR and tracking speed.

In the illustrated embodiment, in a first cycle the transmitter of the tracking device creates orthogonal phases of the transmitted signal and sends them through a hybrid coupler 706, as shown in FIG. 7A. This is accomplished by receiving a signal to be transmitted Tx 701 at node S 712 and feeding this signal through I/Q mixers 702 and 703 to produce two quadrature signals $S_{Q/I}$ 704 and $S_{I/Q}$ 705 where $S_Q = jS_I$ and feed into hybrid coupler 706. Hybrid coupler 706 then combines $S_{I/Q}$ and $S_{Q/I}$ (as is described above with reference to FIG. 3) to produce an output 707 which is proportionate to S, and the output is transmitted through antenna 711. Hybrid coupler 706 also combines $S_{I/Q}$ and $S_{Q/I}$ to produce an output 708 which has a null value.

Next, in a following cycle, the transmitter reverses the phase relationship between the two components by swapping the I and Q control values for phase mixers 702 and 703. (The swapping of the I and Q control values can be accomplished by using a multiplexer or some other switching mechanism.) This swapping of I and Q results in a null output 707 which is similar to turning the switch off from the transmitter.

Figure 7B:
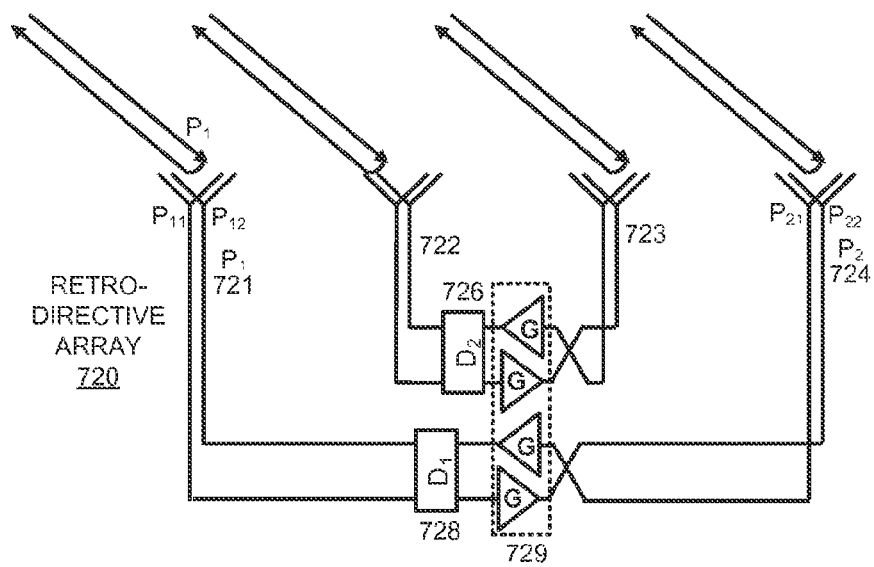
FIG. 7B illustrates a corresponding retro-directive array in accordance with the disclosed embodiments.

This transmitted signal is received at a retro-directive array located on a target, which sends a return signal with a different polarization. For example, retro-directive array 720 illustrated in FIG. 7B receives signals through antenna elements 721-724 and amplifies the signals using gain elements 729 before returning the signals to the transmitter through antenna elements 721-724. (Note that antenna $P_1$ 721 is comprised of spatially orthogonal antenna elements $P_{11}$ and $P_{12}$, and antenna $P_2$ 724 is comprised of spatially orthogonal antenna elements $P_{21}$ and $P_{22}$.) During this process, the polarization of the signals is changed from a first polarization to a second orthogonal polarization. Moreover, delay elements $D_1$ 728 and $D_2$ 726 are used to fine-tune the delays between the received and transmitted signals to ensure that the return signal is accurately steered back to the transmitter.

Figure 7C:
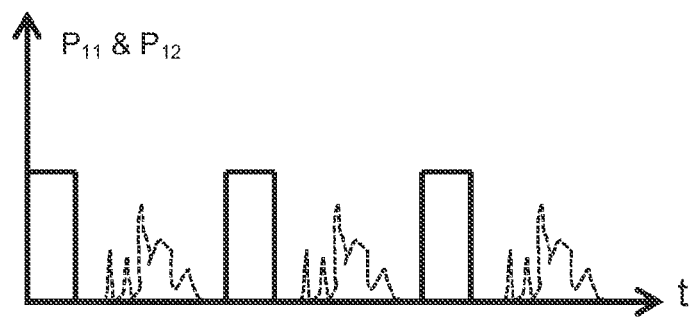
FIG. 7C illustrates associated transmitted and returned signals in accordance with the disclosed embodiments.

As shown in the graph which appears in FIG. 7C, the target changes the polarization of the signal from $P_{11}$ to $P_{12}$, where $P_{12}$ ideally is orthogonal to $P_{11}$, and then returns $P_{12}$ to the tracking device using retro-directive phase conjugation. The signal is then received and processed by the receiver 710 on the tracking device which is connected to an antenna element in antenna 711 with a polarization which matches $P_{12}$. Note that this change in polarization facilitates a high isolation between the transmitter and the receiver of the tracking device without using a conventional transmit-receive switch.

Alternatively for a receiver having a front end which is resilient to high power, the entire system can operate using single polarization, which means there is no need for polarization change on the target side. In this case, because the transmitter and receiver of the tracking device operate with reference to the same clock, the information bit (echoed through the channel) can easily be filtered out from transmitter leakage to the receiver. However, there will be a small signal-to-noise ratio penalty because the received power is divided equally between $Z_{in}$ of the receiver and $Z_{out}$ of the transmitter.

Figure 8A:
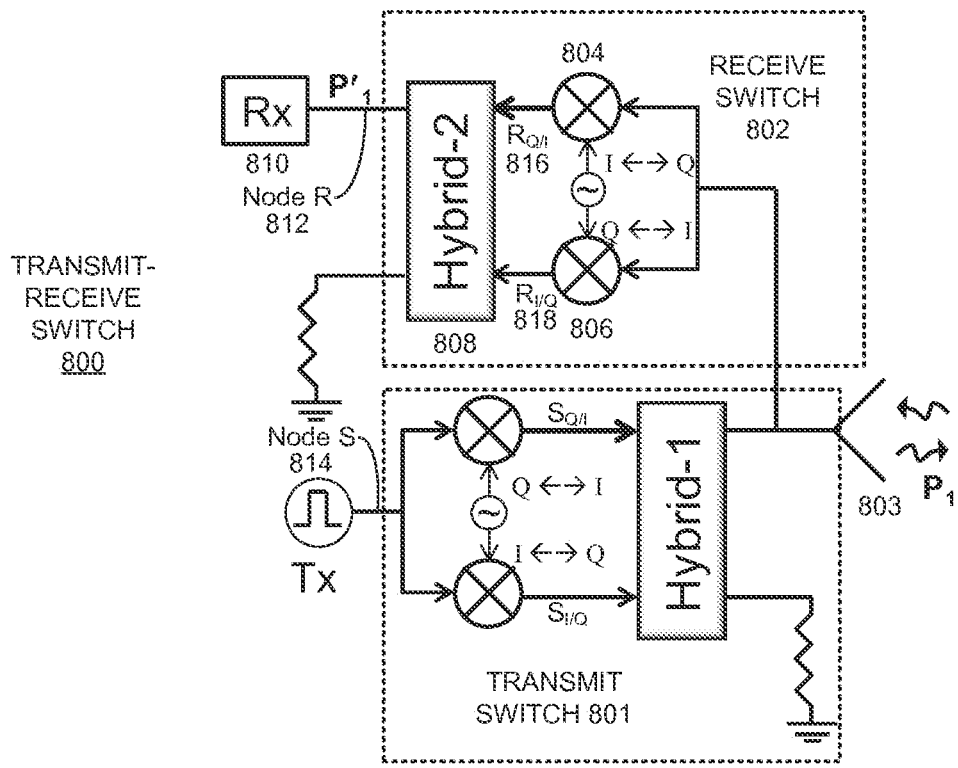
FIG. 8A illustrates a transmit-receive switch in accordance with the disclosed embodiments.

An exemplary transmit-receive switch 800 for a system which operates using a single polarization change appears in FIG. 8A. Transmit-receive switch 800 is comprised of a transmit switch 801 and a receive switch 802. Transmit switch 801 is the same as transmit switch 700 illustrated in FIG. 7A.

Receive switch 802 is similar to transmit switch 700, except that it operates in the reverse direction. More specifically, receive switch 802 receives as input a signal from antenna 803 producing a receive output 810. This involves using two phase mixers 804 and 806 to convert the received signal into a quadrature signal comprising two components $R_{Q/I}$ 816 and $R_{I/Q}$ 818. This quadrature signal feeds into hybrid coupler 808, which produces receive output 810.

When transmit-receive switch 800 is in a transmitting mode, transmit switch 801 receives a signal to be transmitted on node S 814, and feeds a transmit signal to antenna 803 while receive switch 802 produces a null value at receive output 810. In contrast, when transmit-receive switch is in a receiving mode, transmit switch 801 produce a null output, and receive switch 802 directs a signal received on antenna 803 to node R 812 to produce receive output 810. During the process of switching between transmit and receive modes, the I and Q phase inputs to transmit switch 801 and receive switch 802 are swapped at the same time.

Figure 8B:
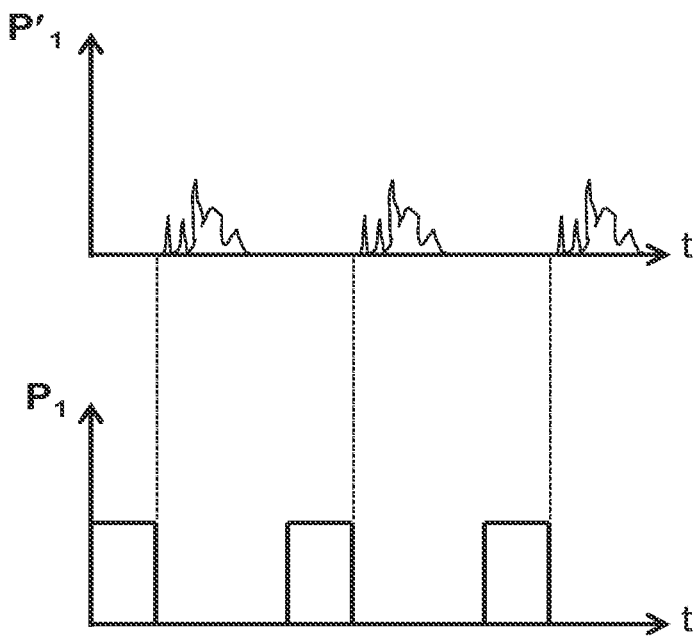
FIG. 8B illustrates associated transmitted and returned signals in accordance with the disclosed embodiments.

FIG. 8B illustrates a transmitted signal $P_1$ which is transmitted from a tracking device toward a target and a corresponding returned signal $P_1'$ which is reflected back from a target in accordance with the disclosed embodiments. Note that during the receiving mode transmit-receive switch 800 effectively isolates the receiver from the transmitted signal, and during the transmitting mode the transmit-receive switch 800 effectively isolates the receiver from the transmit signal.

Process of Operating the Transmit and Receive Switches

Figure 9A:
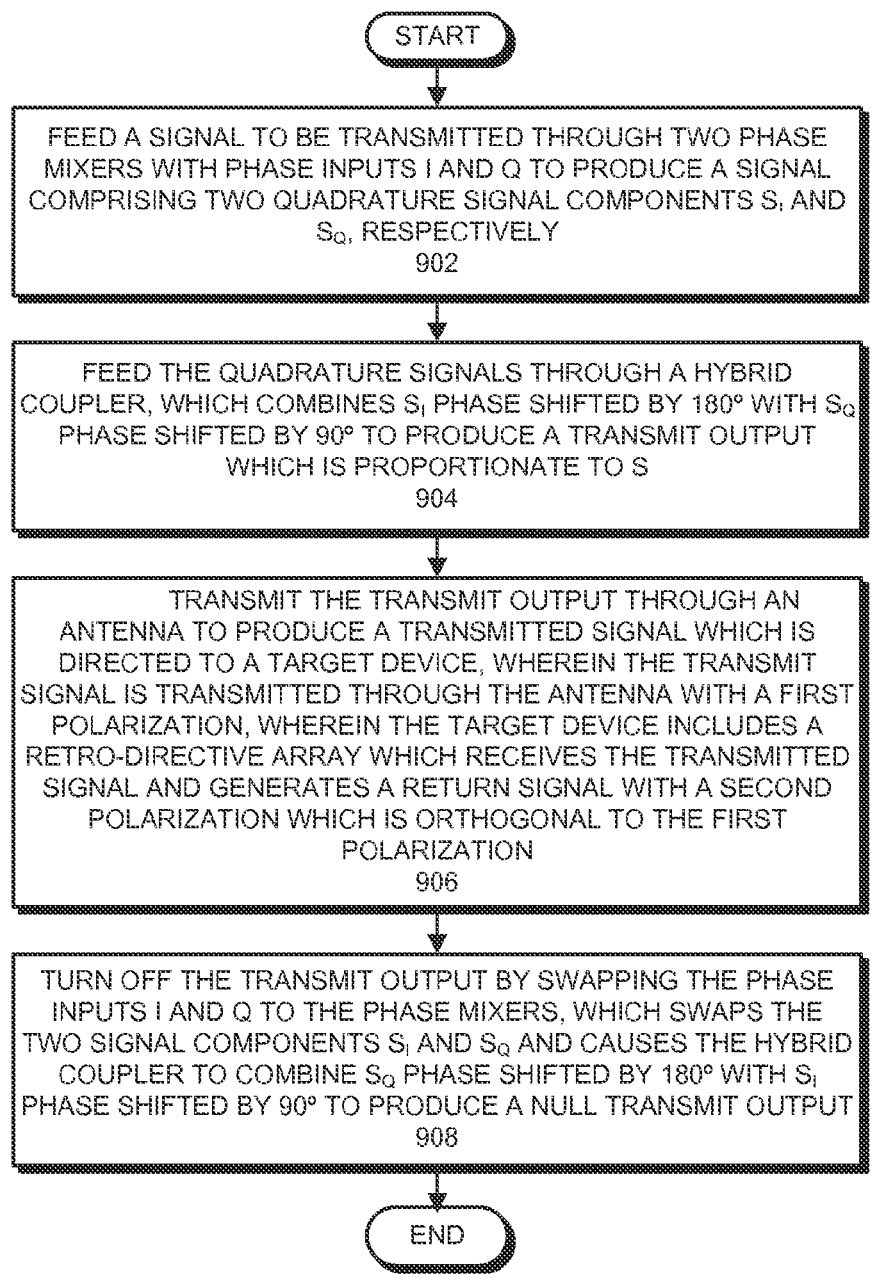
FIG. 9A presents a flow chart illustrating operation of a transmit switch in accordance with the disclosed embodiments.

FIG. 9A presents a flow chart illustrating the steps involved in operating transmit switch 801 in accordance with the disclosed embodiments. First, the system feeds a signal to be transmitted through two phase mixers with phase inputs I and Q to produce a signal comprising two quadrature signal components $S_I$ and $S_Q$ wherein $S_Q=jS_I$ (step 902). Next, the system feeds the quadrature signals through a hybrid coupler, which combines $S_I$ phase shifted by 180° with $S_Q$ phase shifted by 90° to produce a transmit output which is proportionate to S (step 904). Then, the system transmits the transmit output through an antenna toward a target device with a first polarization. This target device includes a retro-directive array which receives the transmitted signal and generates a return signal with a second polarization which is orthogonal to the first polarization (step 906). (The process of receiving this return signal is described in more detail below with reference to FIG. 9B.) Next, the system turns off the transmit output by swapping the phase inputs I and Q to the phase mixers, which swaps the two signal components $S_I$ and $S_Q$ and causes the hybrid coupler to combine $S_Q$ phase shifted by 180° with $S_I$ phase shifted by 90° to produce a null transmit output (step 908).

Figure 9B:
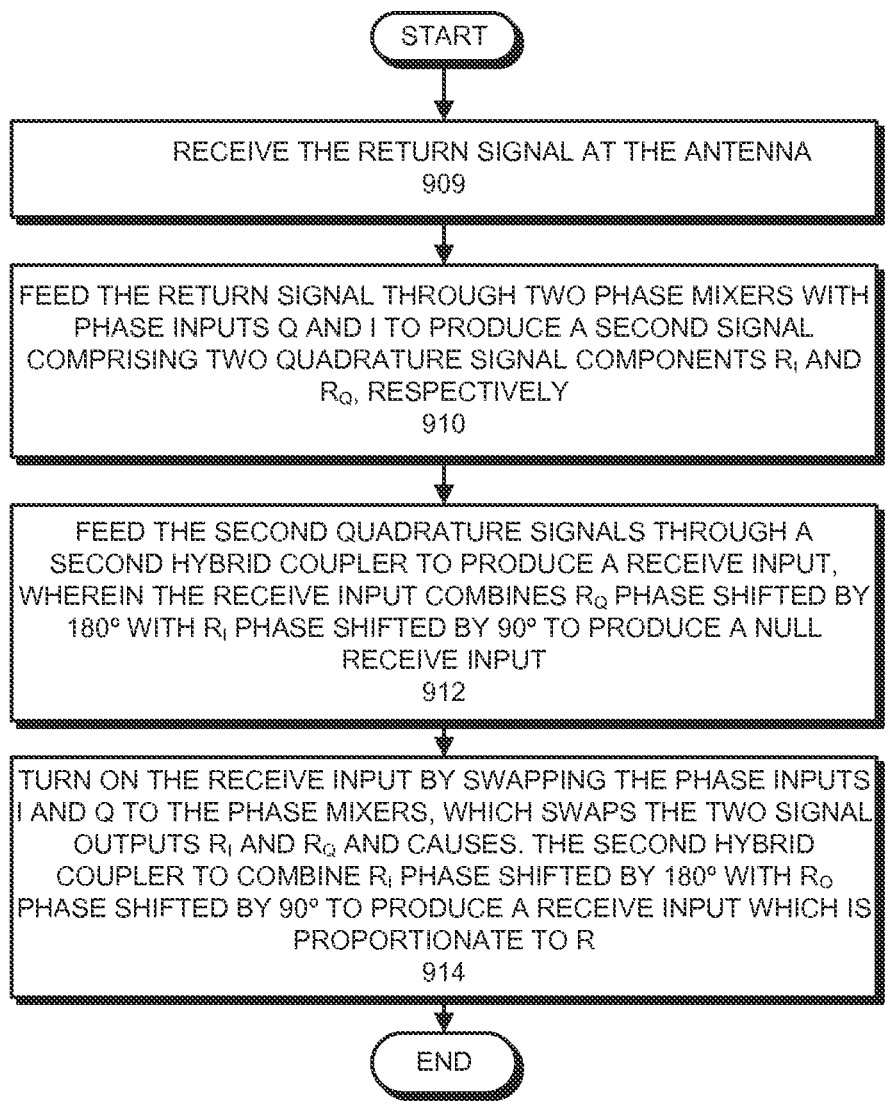
FIG. 9B presents a flow chart illustrating operation of a receive switch in accordance with the disclosed embodiments.

FIG. 9B presents a flow chart illustrating the steps involved in operating the receive switch in accordance with the disclosed embodiments. The receive switch is initially turned off. During this initial "off" state, the system receives the return signal at the antenna (step 909). Next, the system feeds the return signal through two phase mixers with phase inputs I and Q to produce a second signal comprising two quadrature signal components $R_I$ and $R_Q$, respectively, wherein $R_Q=jR_I$ (step 910).

Then, the system feeds the second quadrature signal through a second hybrid coupler to produce a receive input, wherein the receive input combines $R_Q$ phase shifted by 180° with $R_I$ phase shifted by 90° to produce a null receive input (step 912). Next, the system turns on the receive switch by swapping the phase inputs I and Q to the phase mixers. This swaps the two signal outputs $R_I$ and $R_Q$ and causes the second hybrid coupler to combine $R_I$ phase shifted by 180° with $R_Q$ phase shifted by 90° to produce a receive input proportional with R (step 914).

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in but are not limited to, application-specific integrated circuit (ASIC) chips, field-programmable gate arrays (FPGAs), and other programmable-logic devices

What is claimed is:

1. A transmit switch, comprising:
   two phase mixers configured to receive a signal to be transmitted and phase inputs I and Q, and to produce a quadrature signal comprising two signal components $S_Q$ and $S_I$;
   a hybrid coupler, wherein the hybrid coupler is to combine $S_Q$ phase shifted by 90° with $S_I$ phase shifted by 180° to produce a transmit output; and
   a switching mechanism to turn off the transmit output by, swapping the phase inputs I and Q at the phase mixers, and
   combining $S_Q$ phase shifted by 180° with $S_I$ phase shifted by 90° to produce a null transmit output.

2. The transmit switch of claim 1, further comprising an antenna to transmit the transmit signal toward a target device.

3. The transmit switch of claim 2,
   wherein the transmit signal is transmitted through the antenna with a first polarization;
   wherein the target device includes a retro-directive array which receives the transmitted signal and generates a return signal with a second polarization that is orthogonal to the first polarization; and
   wherein the antenna is configured to receive the return signal.

4. The transmit switch of claim 3, wherein the retro-directive array comprises:
   a first dual-polarized antenna with a first element and a second element, which are associated with different polarizations; and
   a second dual-polarized antenna with a first element and a second element, which are associated with different polarizations;
   wherein a first signal received through the first element of the first dual-polarized antenna feeds through a gain element $G_1$ and a delay element $D_1$, and is returned through the second element of the second dual-polarized antenna; and
   wherein a second signal received through the first element of the second dual-polarized antenna feeds through a gain element $G_2$ and a delay element $D_2$, and is returned through the second element of the first dual-polarized antenna.

5. The transmit switch of claim 2,
   wherein the antenna is shared between a transmitter and a receiver, wherein the target device includes a retro-directive array which receives the transmitted signal and generates a return signal, wherein the transmit switch further comprises a receive switch;
   wherein during a transmit cycle the receive switch is turned off by,
   receiving an input from the antenna and feeding the input through two phase mixers with phase inputs Q and I to produce quadrature signals $R_Q$ and $R_I$; and
   combining $R_Q$ phase shifted by 180° with $R_I$ phase shifted by 90° to produce a null receive input; and
   wherein after the transmit cycle, the receive switch is turned on by, swapping the phase inputs Q and I of the two phase mixers, and
   combining $R_I$ phase shifted by 180° with $R_Q$ phase shifted by 90° to receive the return signal.

6. The transmit switch of claim 5, wherein the transmit switch and the receive
   switch are configured to alternate between a transmit cycle and a receive cycle;
   wherein during the transmit cycle, the transmit switch is turned on and the receive switch is turned off; and
   wherein during the receive cycle, the receive switch is turned on and the transmit switch is turned off.

7. A method for operating a retro-directive array, comprising:
   receiving a first input signal at a first antenna comprising two or more antenna elements including at least two spatially orthogonal antenna elements, the first input signal comprising two signal components associated with different orthogonal polarizations, wherein the two signal components are received by the two spatially orthogonal antenna elements, and wherein the two signal components comprise a first quadrature signal;

feeding the two signal components through a bi-directional quadrature gain (BQG) module, the BQG module to boost the first quadrature signal; and transmitting the boosted first quadrature signal through an associated second antenna in the retro-directive array.

8. The method of claim 7, further comprising introducing a delay into at least one of the first quadrature signal and the boosted first quadrature signal.

9. The method of claim 7, further comprising concurrently to receiving the first input signal at the first antenna:

receiving a second input signal at the second antenna, the second antenna to separate the second input signal into two signal components associated with different orthogonal polarizations, and wherein the two signal components comprise a second quadrature signal;

concurrently to feeding the quadrature signal through the BQG module, feeding the second quadrature signal through the BQG module, the BQG module to boost the second quadrature signal, wherein the second quadrature signal feeds through the BQG module in an opposite direction to the first quadrature signal; and concurrently to transmitting the boosted quadrature signal through the BQG module, transmitting the boosted second quadrature signal through the first antenna.

10. The method of claim 7, wherein feeding a quadrature signal having two signal components through the BQG module comprises:

feeding the two signal components through a first hybrid coupler $H_1$ to produce a first output which is zero and a second output;

feeding the second output through a first gain element to produce a boosted second output; and feeding the boosted second output through a second hybrid coupler $H_2$, which produces two signal components that comprise the boosted quadrature signal.

11. The method of claim 7, further comprising using one of a down-conversion and a self-mixing/zero IF technique within the BQG module to facilitate down-link data transfers.

12. The method of claim 7, further comprising modulating gain elements within the BQG module to facilitate up-link data transfers.

13. The method of claim 7, wherein the first antenna and the second antenna are circular-polarized antennas.

14. An apparatus which includes a retro-directive array, wherein the retro-directive array comprises:

a first antenna comprising two or more antenna elements including at least two spatially orthogonal antenna elements, the two spatially orthogonal antenna elements to receive two signal components of a first input signal associated with different orthogonal polarizations, and wherein the two signal components comprise a first quadrature signal;

a bi-directional quadrature gain (BQG) module coupled to the first antenna and configured to boost the first quadrature signal; and a second antenna configured to transmit the boosted first quadrature signal to the tracking device.

15. The apparatus of claim 14, further comprising a delay element to introduce a delay into one of the first quadrature signal and the boosted first quadrature signal.

16. The apparatus of claim 14, wherein concurrently with the first antenna receiving the first input signal, the second antenna is to receive a second input signal which is substantially circularly polarized, the second antenna to separate the second input signal into two signal components associated with different orthogonal polarizations, wherein the two signal components comprise a second quadrature signal;

wherein concurrently with boosting the first quadrature signal, the BQG module is to boost the second quadrature signal, which feeds through the BQG module in an opposite direction to the first quadrature signal; and wherein the first antenna is to transmit the boosted second quadrature signal to the tracking device.

17. The apparatus of claim 16, wherein the BQG module comprises:

a first hybrid coupler $H_1$ to receive the two signal components from the first antenna and to produce a first output which is zero and a second output;

a first gain element to receive the second output and to produce a boosted second output; and a second hybrid coupler $H_2$ to receive the second boosted output and to produce two outputs that comprise the boosted first quadrature signal.

18. The apparatus of claim 14, wherein the BQG module is to use one of a down-conversion and a self-mixing/zero IF technique within the BQG module to facilitate downlink data transfers.

19. The apparatus of claim 14, wherein the BQG module is configured to modulate gain elements within the BQG module to facilitate up-link data transfers.

20. The apparatus of claim 14, wherein the first antenna and the second antenna are circular-polarized antennas.

* * * * *